United States Patent
Nakatsugawa et al.

[11] Patent Number: 6,115,424
[45] Date of Patent: Sep. 5, 2000

[54] CODING METHOD OF DIVIDING INFORMATION BLOCK SERVING AS CONVERSION UNIT INTO A PLURALITY OF SUB-BLOCKS TO PERFORM CODING FOR EACH SUB-BLOCK, AND CODING APPARATUS

[75] Inventors: Yoshinori Nakatsugawa, Shizuoka-ken; Kenji Takemoto, 360-3-3-403, Imajuku, Chigaski-shi, Kanagawa-ken, both of Japan

[73] Assignees: Yazaki Corporation, Tokyo; Kenji Takemoto, Kanagawa-ken, both of Japan

[21] Appl. No.: 09/436,240

[22] Filed: Nov. 9, 1999

[30] Foreign Application Priority Data

Nov. 10, 1998 [JP] Japan .................................. 10-319436

[51] Int. Cl.$^7$ .................................................. H04B 14/04
[52] U.S. Cl. ............................................................ 375/242
[58] Field of Search .................................... 375/242, 253, 375/254, 257, 286

[56] References Cited

U.S. PATENT DOCUMENTS

| | | | |
|---|---|---|---|
| 5,095,417 | 3/1992 | Hagiwara et al. ....................... | 364/138 |
| 5,144,624 | 9/1992 | Sharper et al. .......................... | 370/384 |
| 5,386,528 | 1/1995 | Ando et al. .............................. | 711/207 |

*Primary Examiner*—Don N. Vo
*Attorney, Agent, or Firm*—Finnegan, Henderson, Farabow, Garrett & Dunner, L.L.P.

[57] ABSTRACT

The information block that is sequentially extracted from an information sequence and that serves as a conversion unit is divided into a plurality of sub-blocks, Then, counting is performed of the information items number of at least one of "0" and "1" that is contained in each sub-block for each sub-block of a plurality of the thus-divided sub-blocks. Then, there is performed, according to the counted result that has been thus obtained, inversion yes/no determination of whether the original information contained in each sub-block should be inverted under the consideration of minimizing the difference between the number of codes "0", and the number of codes "1", contained in the code block as a whole. Then, there is performed, regarding the sub-block, with respect to which a determination of that the original information should be inverted has been made, coding of inverting the original information contained in this sub-block and there is added, with respect to this sub-block, an inversion identification code that represents the effect that the original information has been inverted, while, regarding the sub-block, with respect to which a determination of that the original information should not be inverted has been made, there is performed coding of leaving intact the original information contained in this sub-block without inverting the same and, with respect to this sub-block there is added a maintenance identification code that represents the effect that the original information has been left intact. And by unifying a plurality of code sub-blocks, each of which has had either one of the inversion identification code or maintenance identification code added thereto, the information block is converted into a code block.

12 Claims, 3 Drawing Sheets

CODING METHOD OF DIVIDING INFORMATION BLOCK SERVING AS CONVERSION UNIT INTO A PLURALITY OF SUB-BLOCKS TO PERFORM CODING FOR EACH SUB-BLOCK, AND CODING APPARATUS

BACKGROUND OF THE INVENTION

1. Field of the Invention

The present invention relates to a coding method that is used when converting an information block that is sequentially extracted from an information sequence and that serves as a conversion unit into a code block. More particularly, the invention concerns a coding method that can realize the coding wherein D.C. components have been suppressed while suppressing the increase ratio of the code length to the original information bit length as much as possible, and a coding apparatus.

2. Related Art

Several coding methods that are used when converting an information sequence into a code sequence have hitherto been disclosed.

Among them, a CMI code (Coded Mark Inversion code) method is known as one example of the coding method that can realize the coding wherein D.C. components have been suppressed.

The CMI code method is a coding method wherein, as Illustrated in FIG. 1, each time "1" appears in the information sequence, coding thereof is performed by converting the level of a time slot corresponding to this "1" to a high level and a low level in such a way as to change over the level of the time slot alternately to these high level and low level while, on the other hand, each time "0" appears in the information sequence, coding thereof is performed by converting the level of a time slot corresponding to this "0" in such a way that the levels of the first half and the second half prepared by dividing this slot into two equal parts differ from each other.

According to this CMI code method, it is possible to realize the coding wherein D.C. components have been completely suppressed.

Also, as one example of the coding method that can suppress the increase ratio of the code length to the original information bit length as much as possible, there is known a mB1C code (m Binary with 1 Complement insertion code) method.

Among the mB1C code methods, for example, a 10B1C code method is the coding method wherein, as illustrated in FIG. 2, every 10-bit-length information block, an inverted code (P*) of the last information item (P) is added to the information block at a position after the information item (P), whereby coding of the 10-bit-length information block is performed by converting this 10-bit-length information block to a code block having a code length of 11.

According to this 10B1C code method, the increase ratio of the code length to the original information bit length is 1.1 times. Therefore, it is possible to realize the coding wherein this increase ratio has been suppressed as much as possible.

However, in the above-described coding method, there was involved therein the problem to be solved that it is difficult to realize the coding wherein D.C. components have been suppressed while suppressing the increase ratio of the code length to the original information bit length as much as possible.

Namely, according to the CMI code method, the coding wherein D.C components have been completely suppressed can be realized indeed. However, when viewing this code method from the standpoint of the increase ratio of the code length to the original information bit length, because this increase ratio inconveniently becomes twice higher, this code method is not preferable from this standpoint of suppressing the increase ratio.

Meanwhile, according to the 10B1C code method, the coding wherein the increase ratio of the code length to the original information bit length has been suppressed as much as possible can be realized indeed. However, when viewing this code method from the standpoint of the D.C. component suppression degree that is defined by the ratio of the number of the codes "1" contained in the code block to the total number (11) of the codes in the code block, because the range within which the code "1" can take its position is from "1" to 10 and the D.C. component suppression degree thereof changes within a range of from approximately 9% to approximately 91%, this code method is not preferable from the standpoint of D.C. component suppression.

Namely, the suppression of the increase ratio of the code length to the original information bit and the suppression of the D.C. components are mutually in a relationship of trade-off. Therefore, in the above-described conventional coding method, there was involved the problem to be solved that it is extremely difficult to realize the coding wherein D.C. components have been suppressed while suppressing the increase ratio of the code length to the original bit length as much as possible.

Under the above-described circumstances, there has been earnestly expected among the associated people the development of a novel coding method that can realize the coding wherein D.C. components have been suppressed while suppressing the increase ratio of the code length to the original bit length as much as possible.

SUMMARY OF THE INVENTION

The present invention has been achieved in view of the above-described actual circumstances and has an object to provide a coding method that can realize the coding wherein D.C. components have been suppressed while suppressing the increase ratio of the code length to the original bit length as much as possible, and a coding apparatus.

To attain the above object, there is provided a coding method which is used when converting an information block that is sequentially extracted from an information sequence and that serves as a conversion unit into a code block one by one, the coding method comprising the steps of: dividing the information block into a plurality of sub-blocks, counting the information items number of at least either one of "0" and "1" that is contained in each sub-block for each sub-block, performing, according to the counted result that has been obtained for each sub-block, inversion yes/no determination of whether or not the original information contained in each sub-block should be inverted for each sub-block under the consideration of minimizing the difference between the number of codes "0", and the number of codes "1", contained in the code block as a whole, performing, regarding the sub-block, with respect to which a determination of that the original information should be inverted has been made as a result of this inversion yes/no determination, coding of inverting the original information contained in this sub-block and adding, with respect to the code sub-block that has had the original information inverted, an inversion identification code that represents the effect that the original information has been inverted, while, regarding the sub-block, with respect to which a determination of that the original information should not be inverted has been made, performing coding of leaving intact the original information contained in this sub-block without inverting the same and, with respect to the code sub-block that has had the original information maintained as is, adding a maintenance identification code that represents the effect that the original information has been left intact, and unifying a plurality of code sub-blocks, each of which has had either one of the inversion identification code and maintenance identification code added thereto, thereby converting the information block into a code block.

According to the present invention, first, the information block that is sequentially extracted from an information sequence and that serves as a conversion unit is divided into a plurality of sub-blocks. Next, counting is performed of the information items number of at least one of "0" and "1" that is contained in each sub-block for each sub-block. Further, there is performed, according to the counted result that has been obtained for each sub-block, inversion yes/no determination of whether or not the original information contained in each sub-block should be inverted for each sub-block under the consideration of minimizing the difference between the number of codes "0", and the number of codes "1", contained in the code block as a whole. Then, there is performed, regarding the sub-block, with respect to which a determination of that the original information should be inverted has been made as a result of this inversion yes/no determination, coding of inverting the original information contained in this sub-block and there is added, with respect to the code sub-block that has had the original information inverted, an inversion identification code that represents the effect that the original information has been inverted, while, regarding the sub-block, with respect to which a determination of that the original information should not be inverted has been made, there is performed coding of leaving intact the original information contained in this sub-block without inverting the same and, with respect to the code sub-block that has had the original information maintained as is, there is added a maintenance identification code that represents the effect that the original information has been left intact. And by unifying a plurality of code sub-blocks, each of which has had either one of the inversion identification code or maintenance identification code added thereto, the information block is converted into a code block.

In this way, according to the present invention, division is performed of the information block that has a bit length of, for example, 2 m (provided, however, that the m is a natural number) into two equal sub-blocks each having a bit length of m. Then, counting is performed of the information items number of at least one of "0" and "1" that is contained in each sub-block for each sub-block. Then, there is performed, according to the counted result that has been obtained for each sub-block, inversion yes/no determination about whether or not the original information contained in each sub-block should be inverted for each sub-block under the consideration of minimizing the difference between the number of codes "0", and the number of codes "1", contained in the code block as a whole. Then, there is performed, regarding the sub-block, with respect to which a determination of that the original information should be inverted has been made as a result of this inversion yes/no determination, coding of inverting the original information contained in this sub-block and there is added, with respect to the code sub-block that has had the original information inverted, an inversion identification code that represents the effect that the original information has been inverted, while, regarding the sub-block, with respect to which a determination of that the original information should not be inverted has been made, there is performed coding of leaving intact the original information contained in this sub-block without inverting the same and, with respect to the code sub-block that has had the original information maintained as is, there is added a maintenance identification code that represents the effect that the original information has been left intact. And by unifying a plurality of code sub-blocks, each of which has had either one of the inversion identification code or maintenance identification code added thereto, the information block is converted into a code block. Since the invention has been arranged like this, in this case, the increase ratio of the code length to the original information bit length (2 m) is represented by (2 m+2)/2 m. On the other hand, the D.C. component suppression degree that is defined by the ratio of the number of the codes "1" contained in the code block to the code block length changes within the following range when there is the difference between the number of the codes "0" and the number of the codes "1" contained in the code block. Namely, in a case where having adopted a form wherein the codes "1" become the majority, this suppression degree changes within the range of from (m+1)/(2 m+2) to (3 m/2+1)/(2 m+2). In a case where having adopted a form wherein the codes "0" become the majority, this suppression degree changes within the range of from (m/2+1)/(2 m+2) to (m+1)/(2 m+2). Here, assuming that 2 m=10 in order to compare with the 10B1C code method of the prior art, the increase ratio of the code length to the original information bit length is 1.2. The D.C. component suppression degree changes within the range of from 50% to 75% in the case where having adopted the form wherein the codes "1" become the majority. And this suppression degree changes within the range of from 25% to 50% in the case where having adopted the form wherein the codes "0" become the majority. As a result of this, it is possible to obtain the coding method that makes it possible to realize the coding in which the D.C. components have been suppressed while suppressing the increase ratio of the code length to the original information bit length as much as possible.

In a preferred embodiment of the present invention, each of the inversion identification code and the maintenance identification code has a one-code length.

According to this embodiment, since each of the inversion identification code and the maintenance identification code is made to have a one-code length. Therefore, as a result of the addition of the code having a necessary minimum code length to each of the code sub-blocks, it is possible to obtain the coding method that makes it possible to realize the coding in which the D.C. components have been suppressed while suppressing the increase ratio of the code length to the original information bit length as much as possible.

In a preferred embodiment of the present invention, the information block is divided so that the original information bit lengths of the plurality of the divided sub-blocks may be equal to one another.

According to this embodiment, the information block is divided so that the original information bit lengths of a plurality of the divided sub-blocks are equal to one another. Therefore, when designing the coding apparatus for realizing this coding method, it is possible to simplify the design as a result of the fact that the common use of various circuits can be promoted.

In a preferred embodiment of the present invention, in the inversion yes/no determination, according to the counted result that has been obtained for each sub-block, it is determined whether or not the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1", contained in the code block, either one of "0" and "1" be the majority.

According to this embodiment, in the inversion yes/no determination, according to the counted result that has been obtained for each sub-block, it is determined whether the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1" contained in the code block, either one of "0" or "1" be the majority.

In a preferred embodiment of the present invention, when having performed the coding procedure of the information blocks each serving as a conversion unit every conversion unit of a plurality of the conversion units, the inversion yes/no determination, that is based on the consideration of that the codes "1" contained in the code block become the majority, and the inversion yes/no determination, that is based on the consideration of that the codes "0" contained in the code block become the majority, are performed respectively in consideration of that the frequencies with which to perform the respective determinations be substantially in equilibrium with each other as a whole.

According to this embodiment, when having performed the coding procedure of the information blocks each serving as a conversion unit every conversion unit of a plurality of the conversion units, the inversion yes/no determination, that is based on the consideration of that the codes "1" contained in the code block become the majority, and the inversion yes/no determination, that is based on the consideration of that the codes "0" contained in the code block become the majority, are performed respectively inconsideration of that the frequencies with which to perform the respective determinations be substantially in equilibrium with each other as a whole. Therefore, for example, in the code processing system of recording or transmitting the code block, it is possible to obtain the coding method that makes it possible to prevent the occurrence of an offset due to the successive transmission of the code "0" or "1".

In a preferred embodiment of the present invention, no inconvenience occurs even when either of the inversion yes/no determination, that is based on the consideration of that the codes "1" contained in the code block become the majority, and the inversion yes/no determination, that is based on the consideration of that the codes "0" contained in the code block become the majority, is performed successively.

According to this embodiment, no inconvenience occurs even when either of the inversion yes/no determination, that is based on the consideration of that the codes "1" contained in the code block become the majority, and the inversion yes/no determination, that is based on the consideration of that the codes "0" contained in the code block become the majority, is performed successively.

Also, to attain the above object, there is provided a coding apparatus which has been constructed so as to convert an information block that is sequentially extracted from an information sequence and that serves as a conversion unit into a code block one by one, the coding apparatus comprising: dividing means for dividing the information block into a plurality of sub-blocks, a plurality of counting means for counting the information items number of at least one of "0" and "1" that is contained in each sub-block for each sub-block, inversion yes/no determination means for performing, according to the counted result that has been obtained for each sub-block, inversion yes/no determination of whether or not the original information contained in each sub-block should be inverted for each sub-block under the consideration of minimizing the difference between the number of codes "0", and the number of codes "1", contained in the code block as a whole, maintenance/inversion coding means for performing, regarding the sub-block, with respect to which a determination of that the original information should be inverted has been made as a result of this inversion yes/no determination, coding of inverting the original information contained in this sub-block while, regarding the sub-block, with respect to which a determination of that the original information should not be inverted has been made, performing coding of leaving intact the original information contained in this sub-block without inverting the same, and adding and unifying means for adding, with respect to the code sub-block on which coding of inverting the original information has been performed in the maintenance/inversion coding means, an inversion identification code that represents the effect that the original information has been inverted, while, with respect to the code sub-block on which coding of maintaining the original information as it is without inverting the same has been performed in the maintenance/inversion coding means, adding a maintenance identification code that represents the effect that the original information has been left intact, and unifying a plurality of code sub-blocks, each of which has had either one of the inversion identification code and maintenance identification code added thereto.

According to the present invention, first, the dividing means divides the information block into a plurality of sub-blocks. A plurality of the counting means count the information items number of at least either one of "0" or "1" that is contained in each sub-block for each sub-block. The inversion yes/no determination means performs, according to the counted result that has been obtained in a plurality of the counting means for each sub-block, inversion yes/no determination of whether or not the original information contained in each sub-block should be inverted for each sub-block under the consideration of minimizing the difference between the number of codes "0", and the number of codes "1", contained in the code block as a whole. The maintenance/inversion coding means performs, regarding the sub-block, with respect to which a determination of that the original information should be inverted has been made as a result of the inversion yes/no determination performed in the inversion yes/no determination means, coding of inverting the original information contained in this sub-block while, regarding the sub-block, with respect to which a determination of that the original information should not be inverted has been made, performing coding of leaving intact the original information contained in this sub-block without inverting the same. And the adding and unifying means adds, with respect to the code sub-block on which coding of inverting the original information has been performed in the maintenance/inversion coding means, an inversion identification code that represents the effect that the original information has been inverted, while, with respect to the code sub-block on which coding of maintaining the original information as it is without inverting the same has been performed in the maintenance/inversion coding means, adding a maintenance identification code that represents the effect that the original information has been left intact, and unifies a plurality of code sub-blocks, each of which has had either one of the inversion identification code or maintenance identification code added thereto, thereby converting the information block into a code block.

In this way, according to the present invention, division is performed of the information block that has a bit length of, for example, 2 m (provided, however, that the m is a natural number) into two equal sub-blocks each having a bit length of m. Then, counting is performed of the information items number of at least one of "0" and "1" that is contained in each sub-block for each sub-block. Then, there is performed, according to the counted result that has been obtained for each sub-block, inversion yes/no determination about whether or not the original information contained in each sub-block should be inverted for each sub-block under the consideration of minimizing the difference between the number of codes "0", and the number of codes "1", contained in the code block as a whole. Then, there is performed, regarding the sub-block, with respect to which a determination of that the original information should be inverted has been made as a result of this inversion yes/no determination, coding of inverting the original information contained in this sub-block and there is added, with respect to the code sub-block that has had the original information inverted, an inversion identification code that represents the effect that the original information has been inverted, while, regarding the sub-block, with respect to which a determination of that the original information should not be inverted has been made, there is performed coding of leaving intact the original information contained in this sub-block without inverting the same and, with respect to the code sub-block that has had the original information maintained as is, there is added a maintenance identification code that represents the effect that the original information has been left intact. And by unifying a plurality of code sub-blocks, each of which has had either one of the inversion identification code or maintenance identification code added thereto, the information block is converted into a code block. Since the invention has been arranged like this, in this case, the increase ratio of the code length to the original information bit length (2 m) is represented by (2 m+2)/2 m. On the other hand, the D.C. component suppression degree that is defined by the ratio of the number of the codes "1" contained in the code block to the code block length changes within the following range when there is the difference between the number of the codes "0" and the number of the codes "1" contained in the code block. Namely, in a case where having adopted a form wherein the codes "1" become the majority, this suppression degree changes within the range of from (m+1)/(2 m+2) to (3 m/2+1)/(2 m+2). In a case where having adopted a form wherein the codes "0" become the majority, this suppression degree changes within the range of from (m/2+1)/(2 m+2) to (m+1)/(2 m+2). Here, assuming that 2 m=10 in order to compare with the 10B1C code method of the prior art, the increase ratio of the code length to the original information bit length is 1.2. The D.C. component suppression degree changes within the range of from 50% to 75% in the case where having adopted the form wherein the codes "1" become the majority. And this suppression degree changes within the range of from 25% to 50% in the case where having adopted the form wherein the codes "0" become the majority. As a result of this, it is possible to obtain the coding apparatus that makes it possible to realize the coding in which the D.C. components have been suppressed while suppressing the increase ratio of the code length to the original information bit length as much as possible.

In a preferred embodiment of the present invention, each of the inversion identification code and the maintenance identification code has a one-code length.

According to this embodiment, since each of the inversion identification code and the maintenance identification code is made to have a one-code length. Therefore, as a result of the addition of the code having a necessary minimum code length to each of the code sub-blocks, it is possible to obtain the coding method that makes it possible to realize the coding in which the D.C. components have been suppressed while suppressing the increase ratio of the code length to the original information bit length as much as possible.

In a preferred embodiment of the present invention, the dividing means divides the information block into a plurality of sub-blocks so that the original information bit lengths of a plurality of the divided sub-blocks that are obtained by the division are equal to one another.

According to this embodiment, the dividing means divides the information block into a plurality of sub-blocks so that the original information bit lengths of a plurality of the divided sub-blocks that have been obtained by the division are equal to one another. Therefore, when designing the coding apparatus for realizing this coding method, it is possible to simplify the design as a result of the fact that the common use of various circuits can be promoted.

In a preferred embodiment of the present invention, the inversion yes/no determination means performs, according to the counted result that has been obtained for each sub-block by counting performed in a plurality of the counting means, a determination of whether or not the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1" contained in the code block, either one of "0" or "1" be the majority.

According to this embodiment, the inversion yes/no determination means performs, according to the counted result that has been obtained for each sub-block by counting performed in a plurality of the counting means, a determination about whether or not the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1" contained in the code block, either one of "0" and "1" be the majority.

In a preferred embodiment of the present invention, when the coding procedure of the information blocks each serving as a conversion unit has been performed over a plurality of the conversion units, the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, are performed respectively in consideration of that the frequencies with which to perform the respective determinations be substantially in equilibrium with each other as a whole.

According to this embodiment, when the coding procedure of the information blocks each serving as a conversion unit has been performed over a plurality of the conversion units, the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, are performed respectively in consideration of that the frequencies with which to perform the respective determinations be substantially in equilibrium with each other as a whole. Therefore, for example, in the code processing system of recording or transmitting the code block, it is possible to obtain the coding apparatus that makes it possible to prevent the occurrence of an offset due to the successive transmission of the code "0" or "1".

In a preferred embodiment of the present invention, no inconvenience occurs even when either of the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, is performed successively.

According to this embodiment, no inconvenience occurs even when either of the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, is performed successively.

The nature, principle and utility of the invention will become more apparent from the following detailed description when read in conjunction with the accompanying drawings.

DESCRIPTION OF THE PREFERRED EMBODIMENTS

An embodiment of each of a coding method and coding apparatus according to the present invention will now be explained in detail with reference to the drawings.

Figure 1:
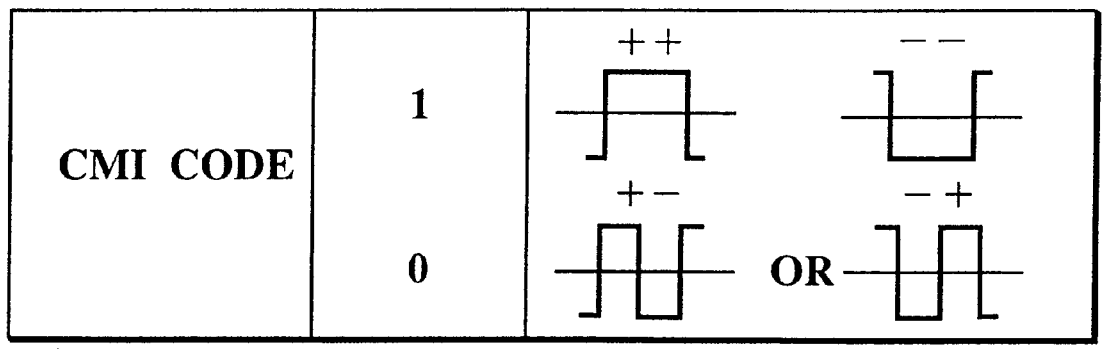
FIG. 1 is a view illustrating a CMI code method according to the prior art.
Figure 2:
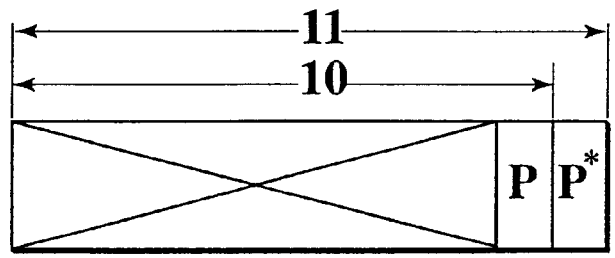
FIG. 2 is a view illustrating a 10B1C code method according to the prior art.
Figure 3:
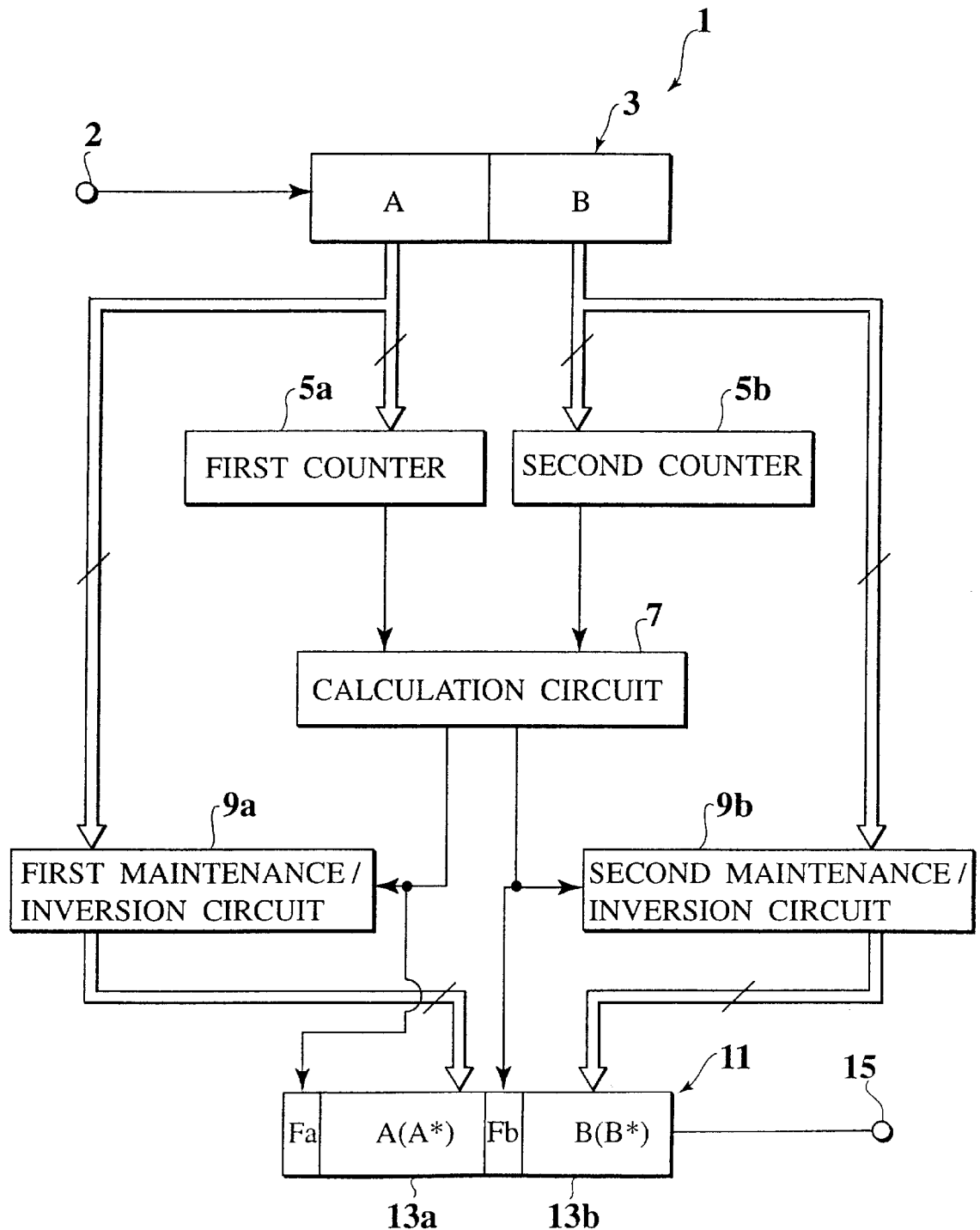
FIG. 3 is a functional-block construction view illustrating a coding apparatus according to the present invention.
Figure 4:
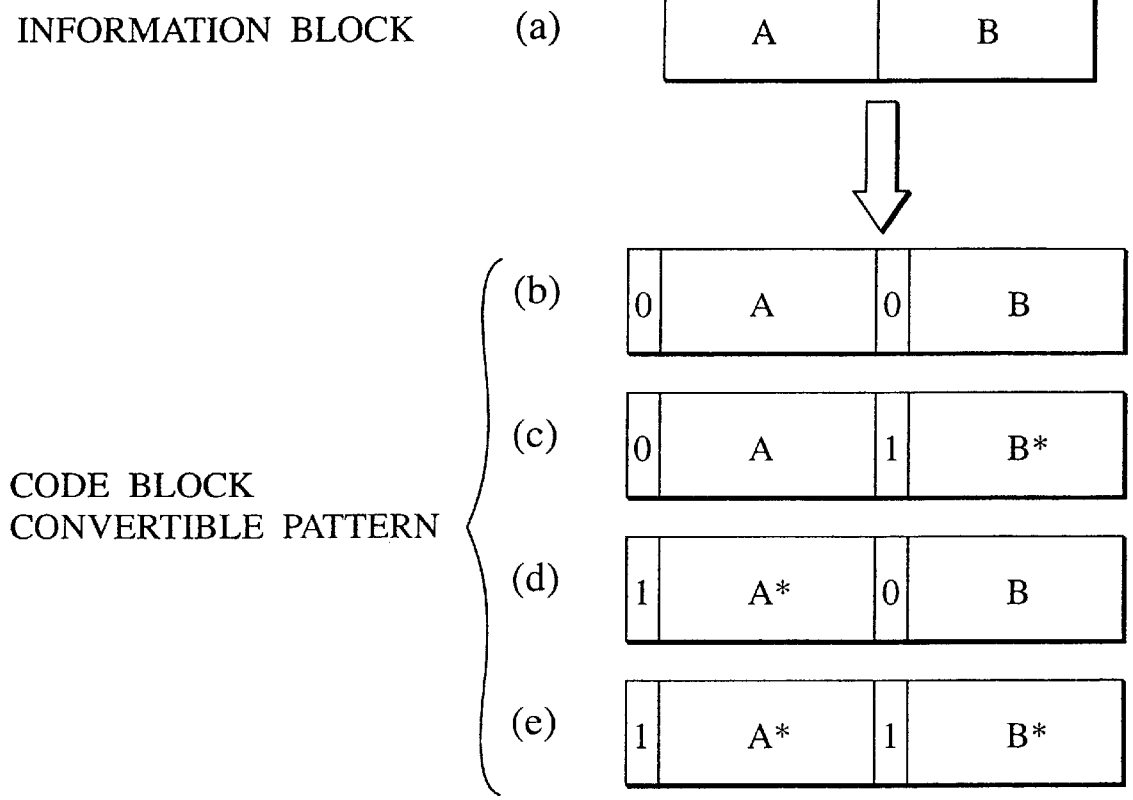
FIG. 4 is a view illustrating a coding method according to the present invention.

FIG. 3 is a functional-block construction view illustrating a coding apparatus according to the present invention; and FIG. 4 is a view illustrating a coding method according to the present invention.

Explaining the outline of the coding method according to the present invention first, the present coding method is the one that is used when converting an information block serving as a conversion unit, in which conversion is to be made, into a code block one by one, the information block being sequentially extracted from information sequence.

Stating in detail, according to the present coding method, first, an information block that is sequentially extracted from information sequence and that serves as a conversion unit is divided into a plurality of sub-blocks. Next, counting is performed of the information items number of at least either one of "0" or "1" that is contained in each sub-block for each sub-block. Further, according to the counted result that has been obtained for each sub-block, inversion yes/no determination of whether the original information contained in each sub-block should be inverted is performed for each sub-block under the consideration of minimizing the difference between the number of codes "0", and the number of codes "1", contained in the code block as a whole. As a result of this inversion yes/no determination, regarding the sub-block, with respect to which a determination of that the original information should be inverted has been made, coding of inverting the original information contained in this sub-block is performed. Simultaneously, with respect to the code sub-block that has had the original information inverted, there is added an inversion identification code that represents the effect that the original information has been inverted. On the other hand, regarding the sub-block, with respect to which a determination of that the original information should not be inverted has been made, coding of leaving intact the original information contained in this sub-block without inverting the same is performed. Simultaneously, with respect to the code sub-block that has had the original information maintained as is, there is added a maintenance identification code that represents the effect that the original information has been left intact. And by unifying a plurality of code sub-blocks, each of which has had either one of the inversion identification code or maintenance identification code added thereto, the information block is converted into a code block.

In this way, according to the present coding method, assuming that the original information bit length be 2 m, the ratio in which the code length increases relative to the original information bit length is represented by (2 m+2)/2 m. On the other hand, the degree of suppression of the D.C. components that is defined by the ratio of the number of the codes "1" contained in the code block to the code block length changes within the following range when there is the difference between the number of the codes "0" and the number of the codes "1" contained in the code block. Namely, in a case where having adopted a form wherein the codes "1" are the majority, this suppression degree changes within the range of from (m+1)/(2 m+2) to (3 m/2+1)/(2 m+2). In a case where having adopted a form wherein the codes "0" are the majority, this suppression degree changes within the range of from (m/2+1)/(2 m+2) to (m+1)/(2 m+2). Here, assuming that 2 m=10 in order to compare with the 10B1C code method of the prior art, the increase ratio of the code length to the original information bit length is 1.2. The D.C. component suppression degree changes within the range of from 50% to 75% in the case where having adopted the form wherein the codes "1" are the majority. And this suppression degree changes within the range of from 25% to 50% in the case where having adopted the form wherein the codes "0" are the majority. As a result of this, it is possible to obtain the coding method that makes it possible to realize the coding in which the D.C. components have been suppressed while suppressing the increase ratio of the code length to the original information bit length as much as possible.

It is to be noted that as a preferred embodiment of the present coding method it can be arranged that each of the inversion identification code and the maintenance identification code has a 1 code length.

If the arrangement is made like this, as a result of the addition of the code having a necessary minimum code length, it is possible to obtain the coding method that makes it possible to realize the coding in which the D.C. components have been suppressed while suppressing the increase ratio of the code length to the original information bit length as much as possible.

Further, as a preferred embodiment of the present coding method it can be also arranged that the division of the information block be performed in consideration of that the original information bit lengths of a plurality of the divided sub-blocks be substantially in equilibrium with one another among these sub-blocks.

If the arrangement is made like this, when designing the coding apparatus for realizing the present coding method, it is possible to simplify the design as a result of the fact that the common use, of various circuits can be promoted.

Further, as a preferred embodiment of the present coding method, in the inversion yes/no determination, it can be arranged that, according to the counted result that has been obtained for each sub-block, it be determined whether the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1" contained in the code block either one of "0" or "1" be the majority.

Also, as a preferred embodiment of the present coding method, when having performed the coding procedure of the information blocks each serving as a conversion unit every conversion unit of a plurality of the conversion units, it can be also arranged that the inversion yes/no determination, that is based on the consideration of that the codes "1" contained in the code block become the majority, and the inversion yes/no determination, that is based on the consideration of that the codes "0" contained in the code block become the majority, are performed respectively in consideration of that the frequencies with which to perform the respective determinations be substantially in equilibrium with each other as a whole.

If the arrangement is made like this, for example, in the code processing system of recording or transmitting the code block, it is possible to obtain the coding method that makes it possible to prevent the occurrence of an offset due to the successive transmission of the code "0" or "1".

And as a preferred embodiment of the present coding method, it is also possible to adopt the way in which no inconvenience occurs even when either of the inversion yes/no determination, that is based on the consideration of that the codes "1" contained in the code block become the majority, and the inversion yes/no determination, that is based on the consideration of that the codes "0" contained in the code block become the majority, is performed successively.

Next, a schematic construction of the coding apparatus 1 according to the present invention will be explained in detail with reference to FIG. 3.

As illustrated in this figure, the present coding apparatus 1 has the function of converting an information block serving as a conversion unit, that is sequentially extracted from an information sequence, into a code block one by one. And the present coding apparatus 1 is constructed of an input terminal 2 that has an information block sequentially input serially, a serial-to-parallel converter (hereinafter called "a S/P converter") 3 that functions as dividing means, a first and a second counter 5a, 5b that function as a plurality of counting means, a calculation circuit 7 that functions as inversion yes/no determination means, a first and a second maintenance/inversion circuit 9a, 9b that function as maintenance/inversion coding means, a parallel-to-serial converter (hereinafter called "a P/S converter") 11 that functions as adding/unifying means, and an output terminal 15 that serially outputs the code block sequentially.

The S/P converter 3 has the conversion function of dividing the information block, which has been input in sequence via the input terminal 2, into a plurality of sub-blocks A, B, and outputting the thus-divided sub-blocks A, B respectively in parallel. Concretely, the S/P converter 3 is arranged to divide the information block having a bit length of, for example, 2 m (provided, however, that the m is a natural number) into two equal sub-blocks A, B each having a bit length of m and to output the respective sub-blocks A, B in parallel.

The first and the second counter 5a, 5b have the counting function of counting the information items number of either one of "0" or "1" contained in the respective sub-blocks A, B respectively independently every corresponding sub-block of the respective sub-blocks A, B that have been divided by the S/P converter 3.

The calculation circuit 7 has the inversion yes/no determination function of performing an inversion yes/no determination of whether the original information contained in each of the sub-blocks A, B should be inverted for each sub-block A, B, according to the counted result that has been obtained for each sub-block A, B by counting performed in the first and the second counter 5a, 5b and under the consideration of minimizing the difference between the number of codes "0", and the number of codes "1", contained in the code block as a whole.

The first and the second maintenance/inversion circuit 9a, 9b have the following maintenance/inversion coding function. Namely, as a result of the inversion yes/no determination performed in the calculation circuit 7, regarding the sub-block, with respect to which a determination of that the original information should be inverted has been made, coding of inverting the original information contained in this sub-block is performed. On the other hand, regarding the sub-block, with respect to which a determination of that the original information should not be inverted has been made, coding of leaving intact the original information contained in this sub-block without inverting the same is performed.

The P/S converter 11 has the following adding and unifying function. With respect to the code sub-block, with respect to which the coding of inverting the original information has been performed in the first and the second maintenance/inversion circuit 9a, 9b, there is added an inversion identification code that represents the effect that the original information has been inverted. On the other hand, with respect to the code sub-block, with respect to which the coding of maintaining the original information without inverting the same has been performed in the first and the second maintenance/inversion circuit 9a, 9b, there is added a maintenance identification code that represents the effect that the original information has been left intact. And a plurality of code sub-blocks 13a, 13b, each of which has had either one of the inversion identification code or maintenance identification code added thereto, are unified. Concretely, the P/S converter 11 is constructed as follows. Namely, for example, with respect to the code sub-block A*, with respect to which the coding of inverting the original information has been performed in the first maintenance/inversion circuit 9a, there is added an inversion identification code Fa(1) that represents the effect that the original information has been inverted. On the other hand, with respect to the code sub-block B, with respect to which the coding of maintaining the original information without inverting the same has been performed in the second maintenance/inversion circuit 9b, there is added a maintenance identification code Fb(0) that represents the effect that the original information has been left intact. And the respective code sub-blocks 13a, 13b, each of which has had the corresponding identification code Fa, Fb, are unified. The P/S converter 11 is further constructed such that the code sub-blocks that have been unified therein are output in sequence via the output terminal 15.

Next, the operation of the coding apparatus 1 having the above-described construction will be explained with reference to FIGS. 3 and 4.

First, the S/P converter 3 divides the information block having a bit length of, for example, 2 m (provided, however, that the m is a natural number), which has been serially input via the input terminal 2, into two equal sub-blocks A, B each having a bit length of m and outputs the respective sub-blocks A, B in parallel.

In response thereto, the first and the second counter 5a, 5b count the information items number of either one of "0" or "1" contained in the respective sub-blocks A, B respectively independently every corresponding sub-block of the respective sub-blocks A, B that have been obtained by being divided by the S/P converter 3.

The calculation circuit 7 performs the inversion yes/no determination of whether the original information contained in each of the sub-blocks A, B should be inverted for each sub-block A, B, according to the counted result that has been obtained for each sub-block A, B by counting performed in the first and the second counter 5a, 5b and under the consideration of minimizing the difference between the number of codes "0", and the number of codes "1", contained in the code block as a whole.

Here, assuming that, as illustrated in part(a) of FIG. 4, the original information block be represented by AB; the information items obtained by inverting all the information bits that belong to the original information block be represented by A* or B*; the inversion identification code be "1" and the maintenance identification code be "0", there exist, as illustrated in part(b) to part(e) of FIG. 4, four patterns of 0A0B, 0A1B*, 1A*0B, and 1A*1B* as the code block conversion possible patterns. On this account, the calculation circuit 7 suitably selects one code block of these four code block conversion possible patterns under the consideration of minimizing the difference between the number of codes "0" and the number of codes "1" contained in the code block. At this time, the code block conversion possible pattern of minimizing the difference between the number of codes "0" and the number of codes "1" contained in the code block exists at least one pair in number from the relationship wherein the codes thereof become mutually inverted codes. Accordingly, selection is suitably made of one code block under the consideration that either one of the code "0" or the code "1" becomes the majority.

In response to the control instructions including this selected result, the first and the second maintenance/inversion circuit 9a, 9b perform the following coding. Namely, regarding the sub-block, with respect to which the determination of that the original information should be inverted has been made, coding of inverting the original information contained in this sub-block is performed. On the other hand, regarding the sub-block, with respect to which the determination of that the original information should not be inverted has been made, coding of leaving intact the original information contained in this sub-block without inverting the same is performed.

The P/S converter 11 operates as follows. With respect to the code sub-block, with respect to which the coding of inverting the original information has been performed in the first and the second maintenance/inversion circuit 9a, 9b, the P/S converter 11 adds an inversion identification code that represents the effect that the original information has been inverted. On the other hand, with respect to the code sub-block, with respect to which the coding of maintaining the original information without inverting the same has been performed in the first and the second maintenance/inversion circuit 9a, 9b, the P/S converter 11 adds a maintenance identification code that represents the effect that the original information has been left intact. Further the P/S converter 11 unifies a plurality of code sub-blocks 13a, 13b, each of which has had either one of the inversion identification code or maintenance identification code added thereto. The code block that has been unified therein is serially output via the output terminal 15.

In this way, according to the coding apparatus 1 of the present invention, division is performed of the information block having a bit length of, for example, 2 m (provided, however, that the m is a natural number), into two equal sub-blocks each having a bit length of m. Then, counting is performed of the information items number of at least either one of "0" or "1" contained in the respective sub-blocks respectively independently every corresponding sub-block of the respective divided sub-blocks. And there is performed the inversion yes/no determination of whether the original information contained in each of the sub-blocks should be inverted for each sub-block according to the counted result that has been obtained for each sub-block and under the consideration of minimizing the difference between the number of codes "0", and the number of codes "1", contained in the code block as a whole. As a result of this inversion yes/no determination, regarding the sub-block, with respect to which the determination of that the original information should be inverted has been made, coding of inverting the original information contained in this sub-block is performed. With respect to the code sub-block, whose original information has been inverted, there is added an inversion identification code having a code length of, for example, 1, which represents the effect that the original information has been inverted. On the other hand, regarding the sub-block, with respect to which the determination of that the original information should not be inverted has been made, coding of leaving intact the original information contained in this sub-block without inverting the same is performed. With respect to the code sub-block, whose original information has been left intact, there is added a maintenance identification code having a code length of, for example, 1, which represents the effect that the original information has been left intact. And the respective code sub-blocks, each of which has had either one of the inversion identification code or maintenance identification code added thereto, are unified. Therefore, in this case, the increase ratio of the code length to the original information bit length (2 m) is represented by (2 m+2)/2 m. On the other hand, the D.C. component suppression degree that is defined by the ratio of the number of the codes "1" contained in the code block to the code block length changes within the following range when there is the difference between the number of the codes "0" and the number of the codes "1" contained in the code block. Namely, in a case where having adopted the form wherein the codes "1" become the majority, this suppression degree changes within the range of from $(m+1)/(2m+2)$ to $(3m/2+1)/(2m+2)$. In a case where having adopted the form wherein the codes "0" become the majority, this suppression degree changes within the range of from $(m/2+1)/(2m+2)$ to $(m+1)/(2m+2)$. Here, assuming that $2m=10$ in order to compare with the 10B1C code method of the prior art, the increase ratio of the code length to the original information bit length is 1.2. The D.C. component suppression degree changes within the range of from 50% to 75% in the case where having adopted the form wherein the codes "1" become the majority. And this suppression degree changes within the range of from 25% to 50% in the case where having adopted the form wherein the codes "0" become the majority. As a result of this, it is possible to obtain the coding method that makes it possible to realize the coding in which the D.C. components have been suppressed while suppressing the increase ratio of the code length to the original information bit length as much as possible.

Additionally, the present invention is not limited to the above-described embodiments and can be worked out in the form having been suitably modified within the scope of the appended claims.

Namely, although, for example, in the above-described embodiments, the form of dividing the information block having a bit length of $2m$ (provided, however, that the m is a natural number) into two equal sub-blocks each having a bit length of m has been explained by way of example, the present invention is not limited to this form. Namely, needless to say, it is possible to suitably adopt a form of dividing the information block having a given bit length into a given number of sub-blocks.

More generally, it should be understood that many modifications and adaptations of the invention will become apparent to those skilled in the art and it is intended to encompass such obvious modifications and changes in the scope of the claims appended hereto.

What is claimed is:

1. A coding method which is used when converting an information block that is sequentially extracted from an information sequence and that serves as a conversion unit into a code block one by one, the coding method comprising the steps of:

dividing the information block into a plurality of sub-blocks;

counting the information items number of at least one of "0" and "1" that is contained in each sub-block for each sub-block;

performing, according to the counted result that has been obtained for each sub-block, inversion yes/no determination about whether or not the original information contained in each sub-block should be inverted for each sub-block under the consideration of minimizing the difference between the number of codes "0", and the number of codes "1", contained in the code block as a whole;

performing, regarding the sub-block, with respect to which a determination of that the original information should be inverted has been made as a result of this inversion yes/no determination, coding of inverting the original information contained in this sub-block and adding, with respect to the code sub-block that has had the original information inverted, an inversion identification code that represents the effect that the original information has been inverted, while, regarding the sub-block, with respect to which a determination of that the original information should not be inverted has been made, performing coding of leaving intact the original information contained in this sub-block without inverting the same and, with respect to the code sub-block that has had the original information maintained as is, adding a maintenance identification code that represents the effect that the original information has been left intact; and unifying a plurality of code sub-blocks, each of which has had either one of the inversion identification code and maintenance identification code added thereto, thereby converting the information block into a code block.

2. A coding method according to claim 1, wherein each of the inversion identification code and the maintenance identification code has a one-code length.

3. A coding method according to claim 1, wherein the information block is divided so that the original information bit lengths of the plurality of the divided sub-blocks obtained by the division are equal to one another.

4. A coding method according to claim 1, wherein in the inversion yes/no determination step, according to the counted result that has been obtained for each sub-block, it is determined whether the original information contained in each sub-block should be inverted for each sub-block under the consideration of minimizing the difference between the number of codes "0", and the number of codes "1", contained in the code block as a whole and under the consideration that, in a case where there is a difference between the number of the codes "0" and the number of the codes "1" contained in the code block, one of "0" and "1" be the majority.

5. A coding method according to claim 4, wherein when the coding procedure of the information blocks each serving as the conversion unit has been performed over a plurality of the conversion units, the inversion yes/no determination, that is based on the consideration of that the codes "1" contained in the code block become the majority, and the inversion yes/no determination, that is based on the consideration of that the codes "0" contained in the code block become the majority, are performed respectively in consideration of that the frequencies with which to perform the respective determinations be substantially in equilibrium with each other as a whole.

6. A coding method according to claim 5, wherein no inconvenience occurs even when either of the inversion yes/no determination, that is based on the consideration of that the codes "1" contained in the code block become the majority, and the inversion yes/no determination, that is based on the consideration of that the codes "0" contained in the code block become the majority, is performed successively.

7. A coding apparatus which has been constructed so as to convert an information block that is sequentially extracted from an information sequence and that serves as a conversion unit into a code block one by one, the coding apparatus comprising:

dividing means for dividing the information block into a plurality of sub-blocks;

a plurality of counting means for counting the information items number of at least one of "0" and "1" that is contained in each sub-block for each sub-block;

inversion yes/no determination means for performing, according to the counted result that has been obtained for each sub-block by counting performed in a plurality of the counting means, inversion yes/no determination of whether the original information contained in each sub-block should be inverted for each sub-block under the consideration of minimizing the difference between the number of codes "0", and the number of codes "1", contained in the code block as a whole;

maintenance/inversion coding means for performing, regarding the sub-block, with respect to which a determination of that the original information should be inverted has been made as a result of this inversion yes/no determination performed in the inversion yes/no determination means, coding of inverting the original information contained in this sub-block while, regarding the sub-block, with respect to which a determination of that the original information should not be inverted has been made, performing coding of leaving intact the original information contained in this sub-block without inverting the same; and adding and unifying means for adding, with respect to the code sub-block on which coding of inverting the original information has been performed in the maintenance/inversion coding means, an inversion identification code that represents the effect that the original information has been inverted, while, with respect to the code sub-block on which coding of maintaining the original information as it is without inverting the same has been performed in the maintenance/inversion coding means, adding a maintenance identification code that represents the effect that the original information has been left intact, and for unifying a plurality of code sub-blocks, each of which has had one of the inversion identification code and maintenance identification code added thereto.

8. A coding apparatus according to claim 7, wherein each of the inversion identification code and the maintenance identification code has a one-code length.

9. A coding apparatus according to claim 7, wherein the dividing means divides the information block into a plurality of sub-blocks so that the original information bit lengths of a plurality of the divided sub-blocks that are obtained by division are equal to one another.

10. A coding apparatus according to claim 7, wherein the inversion yes/no determination means performs, according to the counted result that has been obtained for each sub-block by counting performed in a plurality of the counting means, a determination about whether or not the original information contained in each sub-block should be inverted for each sub-block under the consideration of minimizing the difference between the number of codes "0", and the number of codes "1", contained in the code block as a whole and under the consideration that, in a case where there is the difference between the number of the codes "0" and the number of the codes "1" contained in the code block, one of "0" and "1" be the majority.

11. A coding apparatus according to claim 10, wherein when the coding procedure of the information blocks each serving as a conversion unit has been performed over a plurality of the conversion units, the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, are performed respectively in consideration of that the frequencies with which to perform the respective determinations be substantially in equilibrium with each other as a whole.

12. A coding apparatus according to claim 11, wherein no inconvenience occurs even when either of the inversion yes/no determination performed in the inversion yes/no determination means, that is based on the consideration of that the codes "1" contained in the code block become the majority, and the inversion yes/no determination performed therein, that is based on the consideration of that the codes "0" contained in the code block become the majority, is performed successively.

* * * * *

UNITED STATES PATENT AND TRADEMARK OFFICE
CERTIFICATE OF CORRECTION

PATENT NO.   : 6,115,424
DATED        : September 5, 2000
INVENTOR(S)  : Yoshinori Nakatsugawa et al.

It is certified that error appears in the above-identified patent and that said Letters Patent is hereby corrected as shown below:

<u>Title page,</u>
Item [75], Inventors, "chigaski-shi" should read -- Chigasaki-shi --.

Item [57], ABSTRACT,
Line 3, "sub-blocks," should read -- sub-blocks. --.

Signed and Sealed this

Fifth Day of August, 2003

JAMES E. ROGAN
*Director of the United States Patent and Trademark Office*